(12) United States Patent
Park et al.

(10) Patent No.: US 6,395,450 B1
(45) Date of Patent: May 28, 2002

(54) POSITIVE WORKING PHOTORESIST COMPOSITION

(75) Inventors: Jae-Geun Park; Chang-Ho Noh; Bong-Seok Moon; Sang-Kyun Lee; Seong-Yun Moon, all of Taejeon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/583,547

(22) Filed: Jun. 1, 2000

(30) Foreign Application Priority Data

May 31, 1999 (KR) .............................. 99-19806

(51) Int. Cl.$^7$ .................. G03F 7/004; C07C 33/00
(52) U.S. Cl. .................. 430/270.1; 430/281.1; 430/325; 430/326; 430/921; 568/18; 568/77
(58) Field of Search .................. 430/281.1, 270.1, 430/325, 326, 921; 568/18, 77

(56) References Cited

U.S. PATENT DOCUMENTS

| | | | |
|---|---|---|---|
| 4,491,628 A | 1/1985 | Ito et al. ................. | 430/176 |
| 4,760,013 A | 7/1988 | Hacker et al. ............ | 430/280 |
| 5,191,069 A | 3/1993 | Roeschert et al. ........ | 534/556 |
| 5,342,734 A | 8/1994 | Lazarus et al. ........... | 430/270 |
| 5,362,607 A | 11/1994 | Crivello et al. ........... | 430/326 |
| 5,397,680 A | 3/1995 | Schadeli et al. .......... | 430/270 |
| 5,474,876 A | * 12/1995 | Haehnle et al. .......... | 430/283 |
| 5,852,128 A | * 12/1998 | Padmanaban et al. ... | 525/328.8 |
| 5,981,140 A | * 11/1999 | Sato et al. ............... | 430/270.1 |

OTHER PUBLICATIONS

Novel Deep UV Photoresist, Moon et al., J.Photopolm-.Sci.Technol., 11(3), 1998, 439–444.*

* cited by examiner

*Primary Examiner*—Rosemary Ashton
(74) *Attorney, Agent, or Firm*—Lee & Sterba, P.C.

(57) ABSTRACT

A positive working photoresist composition includes at least one thermally cross-linkable photoacid generator, a binder polymer, and a solvent in which the binder polymer and photoacid generator are dissolved. The photoacid generator is represented by the general formula (I):

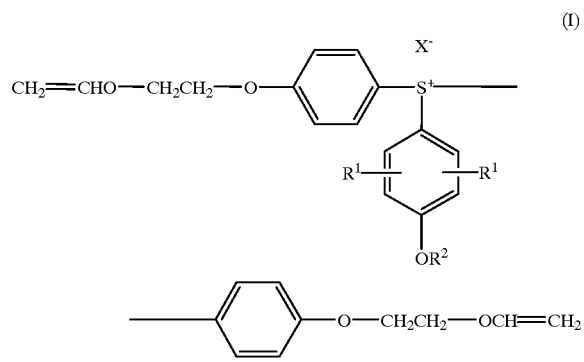

wherein
X is methanesulfonate, trifluoromethanesulfonate, 4-toluenesulfonate, 10-camphorsulfonate, cyclohexane sulfamate, perfluoro-1-butanesulfonate, perfluorooctanesulfonate, F, Cl, Br, $SbF_6$, $BF_4$, $PF_4$, or $AsF_6$,
$R^1$ is hydrogen or methyl, and
$R^2$ is alkyl of $C_{1-10}$ or vinyloxyethyl.

The binder polymer represented by the general formula (II):

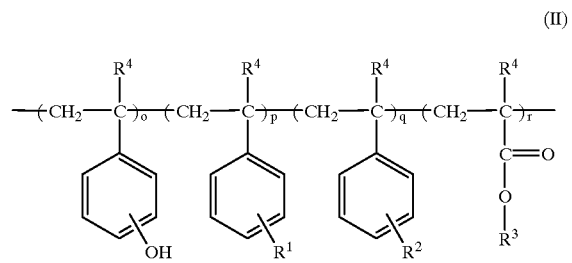

wherein $R^1$ and $R^2$ are different from each other and are selected from the group consisting of acid labile groups, hydrogen, methoxy, ethoxy, n-butoxy and t-butoxy, $R^3$ is hydrogen or alkyl of $C_{1-10}$, $R^4$ is hydrogen or methyl, $0<o\leq1$, $0\leq p\leq0.7$, $0\leq q\leq0.7$, and $0\leq r\leq0.3$, wherein p, q and r are not 0 simultaneously.

31 Claims, No Drawings

POSITIVE WORKING PHOTORESIST COMPOSITION

FIELD OF THE INVENTION

The present invention relates to a positive working photoresist composition with high sensitivity and resolution, and with good photosensitivity to various radiations, such as KrF excimer laser light. More particularly, the present invention relates to a positive working photoresist composition which comprises at least one thermally cross-linkable photoacid generator, a binder polymer, and a solvent in which the binder polymer and photoacid generator are dissolved.

BACKGROUND OF THE INVENTION

A positive photoresist composition for precise processing is an important material in the microlithography which leads to an improved integration of LSI semiconductors. The photoresists should have etching resistance to form relief images on the substrate upon exposure to actinic radiation, such as UV, deep UV or X-ray radiation, or to electron beams.

The integration of LSI semiconductors has been rapidly improved in recent years, and the improvement of the integration can be achieved through precise processing. For this purpose, the photoresists should have high resolution, sensitivity, and etching resistance. A conventional method of forming a precise pattern shall be described as follows:

A photoresist composition is coated by spin coating on a silicon wafer, the coated Si wafer is baked at high temperature, and the resist is exposed to actinic radiation through a pattern mask. The exposed resist on the Si wafer is post-exposure baked at high temperature again, and the Si wafer is developed in a developer solution to form a resist pattern. A dry etching or wet etching is conducted on the resist pattern so formed. When the exposed area of the resist is dissolved in a developer solution, the resist is called as positive working resist. When the exposed area of the resist is not dissolved in a developer solution (i.e., when the unexposed area of the resist is dissolved), it is called as negative working resist.

High sensitivity is required of a resist in order to increase productivity. High resist sensitivity can be achieved through chemical amplification based upon acid catalyst reaction in the resist. Such a chemical amplification resist includes a photoacid generator in its composition. An acid is produced by the photoacid generator during exposure, and amplified during post-exposure bake (PEB) to produce a catalyst reaction such as degradation and cross-linking. As the amplification distance of the acid is as short as about 5 nm, a resist having high resolution and sensitivity can be obtained.

Recently a new chemical amplification type resist has been disclosed, which is based upon a thermal cross-linking reaction of acid labile vinyl ether groups and a degradation reaction of the acid labile groups. This type of resist includes as a binder a polymer of phenol resin having vinyl ether groups partially on the side chain, and a photoacid generator. The resist film, coated on a Si wafer, is cross-linked by a thermal cross-linking reaction of the vinyl ether groups with the phenol portion during post-apply bake (PAB). When being exposed to actinic radiation, the photoacid generator produces acid, which is amplified during PEB to cause a degradation reaction of the acetal-based cross-linked network. Accordingly, a positive-tone chemically amplified resist is obtained. An onium salt is used as a photoacid generator. However, the onium salt produces a hydrophobic compound during degradation, which will inhibit the solubility of the resist on the exposed portion so as to degrade the sensitivity and resolution of the resist.

The present inventors filed patent applications in Korea (Korean Patent Application Nos. 97-53062 and 97-52797) on new photoresist compositions in which a triphenyl sulfonium salt having vinyl ether groups therein is employed as a thermal cross-linking photoacid generator, and polyhydroxystyrene as a binder polymer. The sulfonium salt functions not only as a photoacid generator, but also as a cross-linking agent. The vinyl ether groups of the photoacid generator react with the Brönsted acid of the binder polymer during PAB to form an acetal-based cross-linked network. Upon exposure to actinic radiation, the sulfonium salt forming the acetal-based cross-linked network is degraded, resulting in increased solubility of the exposed portion. Also, the exposure to actinic radiation causes photodegradation of the photoacid generator to produce acid. The acid is amplified during PEB to produce a degradation reaction of the acetal-based cross-linked network by the action of the acid catalyst. Accordingly, the exposed portion is dissolved. The photoacid generator provides a photodegradable product having hydrophilic hydroxyl groups after photodegradation thereof. Consequently, the resist compositions of the foregoing Korean patent applications are distinguished from the conventional chemical amplification resist and have high sensitivity and resolution which are obtained through direct photodegradation and chemical amplification.

However, the aforementioned resist compositions have lower transmittance due to the use of large amounts of the photoacid generator. Further, a high temperature is required at the PAB step to accomplish the chemical cross-linking reaction. Furthermore, the photoacid generators usable in the resist compositions are limited to triflic acids, methanesulfonic acids, and halogenic acids.

A need exists for a new photoresist composition with high contrast and resolution and good photosensitivity.

SUMMARY OF THE INVENTION

A feature of the present invention is the provision of a positive working photoresist composition with high contrast and resolution, and with good photosensitivity to various radiations such as KrF excimer laser light.

Another feature of the present invention is the provision of a positive working photoresist composition with high transmittance.

A further feature of the present invention is the provision of a positive working photoresist composition with which the post-apply bake (PAB) is conducted at a from about temperature of about 90 to about 140° C.

A further feature of the present invention is the provision of a positive working photoresist composition in which various photoacid generators can be used.

In accordance with one aspect of the present invention, a photoresist composition is provided that includes at least one thermally cross-linkable photoacid generator, a binder polymer, and a solvent in which the binder polymer and photoacid generator are dissolved.

The thermally cross-linkable photoacid generator is represented by the general formula (I):

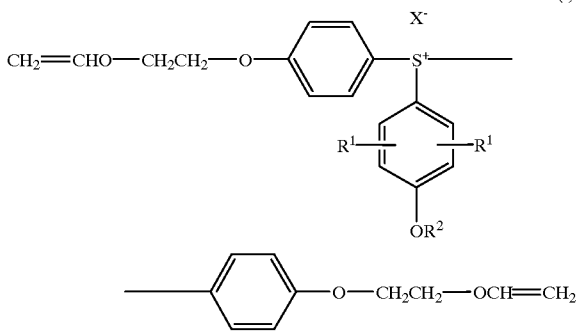

wherein
X is methanesulfonate, trifluoromethanesulfonate, 4-toluenesulfonate, 10-camphorsulfonate, cyclohexane sulfamate, perfluoro-1-butanesulfonate, perfluorooctanesulfonate, F, Cl, Br, $SbF_6$, $BF_4$, $PF_4$, or $AsF_6$, $R^1$ is hydrogen or methyl, and $R^2$ is alkyl of $C_{1-10}$ or vinyloxyethyl.

In more specific embodiments, $R^2$ in the thermally cross-linkable photoacid generator is methyl.

The binder polymer is represented by the general formula (II):

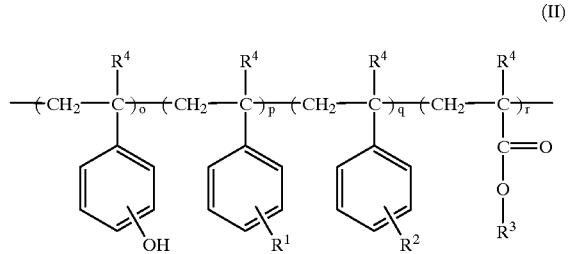

wherein $R^1$ and $R^2$ are different from each other and are selected from the group consisting of acid labile groups, hydrogen, methoxy, ethoxy, n-butoxy and t-butoxy, $R^3$ is hydrogen or alkyl of $C_{1-10}$, $R^4$ is hydrogen or methyl, $0<o<1$, $0 \leq p \leq 0.7$, $0 \leq q \leq 0.7$, and $0 \leq r \leq 0.3$, wherein p, q and r are not 0 simultaneously.

In more specific embodiments, $R^1$ and $R^2$ in the binder polymer are groups such as 1-ethoxyethoxy, 1-isobutoxyethoxy, 1-cyclohexyloxyethoxy, 1-chloroethoxyethoxy, tetrahydropyranyloxy, t-butoxycarbonyloxy, trimethylsilyloxy, vinyloxyethyl, hydrogen, methoxy, ethoxy, n-butoxy or t-butoxy. $R^3$ in more specific embodiments is a group such as n-butyl or t-butyl.

The thermally cross-linkable photoacid generator preferably is employed in an amount from about 0.05 to about 15% by weight based on the weight of the binder polymer.

In accordance with another aspect of the present invention, a thermally cross-linkable photoacid generator as set forth above is provided.

In accordance with a further aspect of the present invention, a method of forming a resist pattern is provided. The method includes the steps of applying a layer of a photoresist composition as set forth above onto a substrate; heat treating the layer and then exposing the layer to actinic radiation, more particularly radiation having a wavelength from about 190 nm to about 400 nm, or an electron beam, through a pattern mask; heat treating the exposed layer; and developing the exposed layer with a developer.

Other features and advantages of the present invention will become apparent to those skilled in the art from the following detailed description. It is to be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF THE INVENTION

The priority Korean Patent Application No. 1999-19806, filed May 31, 1999, is incorporated herein in its entirety by reference.

The photoresist composition according to the present invention comprises a binder polymer, at least one thermally cross-linkable photoacid generator, and a solvent in which the binder polymer and photoacid generator are dissolved.

The thermally cross-linkable photoacid generator of the present invention is modified from the conventional sulfonium salts as thermally cross-linkable photoacid generator. Unlike the known thermally cross-linkable photoacid generators, the photoacid generator of this invention can produce bulky organic acids.

The vinyl ether groups of the inventive thermally cross-linkable photoacid generator react with the Bronsted acid of the binder polymer during PAB, which in particular embodiments is conducted at a temperature from about 90 to about 140° C., to form a cross-linked network. The exposure to actinic radiation, more particularly radiations having a wavelength from about 190 nm to about 400 nm, or electron beams, causes photodegradation of the photoacid generator to produce acid.

The photoresist composition according to the present invention includes at least one thermally cross-linkable photoacid generator which is represented by general formula (I). The at least one thermally cross-linkable photoacid generator is employed in the amount of about 0.05 to about 15% by weight based on the weight of the binder polymer.

The thermally cross-linkable photoacid generator is represented by the general formula (I):

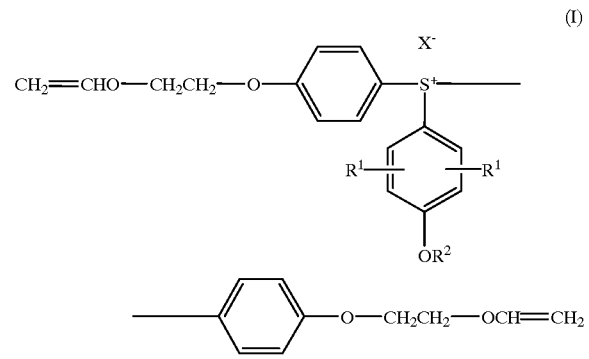

wherein
X is methanesulfonate, trifluoromethanesulfonate, 4-toluenesulfonate, 10-camphorsulfonate, cyclohexane sulfamate, perfluoro-1-butanesulfonate, perfluorooctanesulfonate, F, Cl, Br, $SbF_6$, $BF_4$, $PF_4$, or $AsF_6$, $R^1$ is hydrogen or methyl, and $R^2$ is alkyl of $C_{1-10}$ or vinyloxyethyl.

In more specific embodiments, $R^2$ in the thermally cross-linkable photoacid generator is methyl.

The binder polymer is represented by the general formula (II):

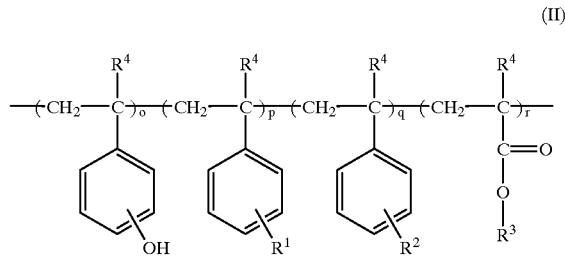

(II)

wherein $R^1$ and $R^2$ are different from each other and are selected from the group consisting of acid labile groups, hydrogen, methoxy, ethoxy, n-butoxy and t-butoxy, $R^3$ is hydrogen or alkyl of $C_{1-10}$, $R^4$ is hydrogen or methyl, $0<o\leq 1$, $0\leq p\leq 0.7$, $0\leq q\leq 0.7$, and $0\leq r\leq 0.3$, wherein p, q and r are not 0 simultaneously.

The binder polymer preferably has a weight average molecular weight from about 5,000 to about 50,000.

In more particular embodiments, the acid labile groups in the binder polymer are groups such as 1-ethoxyethoxy, 1-isobutoxyethoxy, 1-chloroethoxyethoxy, tetrahydropyranyloxy, t-butoxycarbonyloxy, trimethylsilyloxy or vinyloxyethyl.

$R^3$ in more specific embodiments of the binder polymer is a group such as n-butyl or t-butyl.

In particular preferred embodiments, r is 0, $0.05<p<0.45$, and $0.05<q<0.45$ in the binder polymer. In additional preferred embodiments, q and r are 0, and $0.01<p<0.6$ in the binder polymer.

Further more specific embodiments of the inventive positive working photoresist composition can also include one or more additives such as a conventional photoacid generator, at least one thermal cross-linking agent, a basic compound, a surfactant, a sensitivity improving agent, an adhesive additive, a stabilizing agent and the like.

If desired, the photoresist composition according to the present invention can include at least one conventional photoacid generator for generating acid but not cross-linking. The conventional photoacid generator can be employed in an amount from about 0.05 to about 15% by weight based on the weight of the binder polymer.

Representative examples of the conventional photoacid generator include, without limitation, sulfonium salts, iodonium salts, phosphonium salts, diazonium salts, ammonium salts, selenium salts, halogen-containing compounds, diazoketones, sulphones or sulfonic compounds, nitrobenzyl ester compounds, and the like.

The photoresist composition according to the present invention can also include at least one thermal cross-linking agent for cross-linking but not generating acid. Such thermal cross-linking agent preferably is a monomer or polymer having at least one vinyloxyethoxy group in its structure. The thermal cross-linking agent can be employed in an effective amount from about 0 to about 30% by weight based on the weight of the binder polymer.

Representative examples of the thermal cross-linking agent include, without limitation, 2,2-bis{4-[2-(vinyloxy)ethoxy]phenyl}propane, 1,1,1-tris{4-[2-(vinyloxy)ethoxy]phenyl}ethane, 1,3,5-tris[2-(vinyloxy)ethoxy]benzene, 1,2,3-tris[2-(vinyloxy)ethoxy]benzene, 2,2-bis{4-[2-(vinyloxy)ethoxy]cyclohexyl}propane, and 1,4-bis{4-[2-(vinyloxy)ethoxy]phenyl}cyclohexane.

At least one basic compound can be used, in more particular embodiments of the inventive photoresist composition, in order to improve the pattern characteristics. The basic compound preferably is a monomer or polymer having at least one amine group in its structure, a phosphine oxide derivative, or a hydrazine derivative. The basic compound can be employed in an effective amount from about 0 to about 10% by weight based on the weight of the binder polymer.

Further more specific embodiments of the positive working photoresist composition of the present invention can include one or more additives such as a surfactant, a sensitivity improving agent, an adhesive additive, a stabilizing agent and the like, if desired. Two exemplary types of surfactant useful in such embodiments include ether compounds and fluorine compounds. Non-limiting examples of ether compounds include polyoxyethylene lauryl ether, polyoxyethylene stearyl ether, polyoxyethylene oleyl ether, and polyoxyethylene nonyl ether. Non-limiting examples of fluorine compounds include MEGAFACE R-08 (trademark; Dainippon Ink Co.), Fluorad FC430 (trademark; Dupont), and MEGAFACE LS-11 (trademark; Dainippon Ink Co.). The sensitivity improving agent, adhesive additive, and stabilizing agent preferably are azo compounds or amine compounds. Those components are preferably employed in an effective amount from about 0 to about 5% by weight based on the weight of the binder polymer.

The solvent employed in the inventive photoresist dissolves not only the binder polymer and photoacid generator but also the additives such as the cross-linking agent, conventional photoacid generator, basic compound, surfactant, sensitivity improving agent, adhesive additive, stabilizing agent and the like when such additives are employed. The solvent is used in an amount such that the binder polymer comprises about 5 to about 25% by weight based on the weight of the solvent.

Non-limiting examples of solvents useful according to the invention include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol methyl ether acetate, propylene glycol propyl ether acetate, diethylene glycol diethyl ether, ethyl actate, toluene, xylene, methyl ethyl ketone, cyclohexanone, 2-heptanone, 3-heptanone, 4-heptanone, and mixtures thereof.

An additional solvent can be used, together with the foregoing solvent (hereinafter the "major solvent"), in more specific embodiments if desired. Non-limiting examples of such additional solvents include N-methylformamide, N,N-dimethylformamide, N-methylacetamide, N,N-dimethylacetamide, N-methylpyrrolidone, dimethylsulfoxide, and alcohols of $C_{1-10}$. The additional solvent preferably is employed in an effective amount from about 0 to about 10% by weight based on the weight of the major solvent.

The present invention will be described in more detail by the following Examples. The Examples are given only to illustrate the present invention and not intended in any way to limit the scope of the invention.

EXAMPLES

Synthesis of Bis{4-[2-(vinyloxy)ethoxy]benzene}-3,5-dimethyl-4-[2-(vinyloxy)ethoxy]benzene sulfonium tosylate The photoacid generator was prepared in the same manner as disclosed in Korean Patent No. 97-52797.

4,4-dihydroxyphenylsulfoxide (0.15 ml) and 2,6-dimethylphenol (0.15 ml) were dissolved in 100 ml of methylene chloride. To the solution was added a mixture of phosphorus oxide and methane sulfonic acid in the ratio of 1 to 10 by weight, and the reaction proceeded at room temperature. Upon completion of the reaction, the resulting solution was poured into excess ether to crystallize slowly bis(4-hydroxyphenyl)-3,5-dimethyl-4-hydroxyphenyl sulfonium methane sulfonate. The bis(4-hydroxyphenyl)-3,5-dimethyl-4-hydroxyphenyl sulfonium methane sulfonate (0.04 mol) was dissolved in dimethylsulfoxide solution, and to this solution was added 0.24 mol of NaOH. The solution was then agitated at 60° C. for one hour. To the resulting solution was slowly added 0.24 mol of 2-chloroethyl vinyl ether. The solution was heated to 80° C., and the reaction then proceeded for eight hours. The reacted mixture was washed with ether, and the solution was separated with a separatory funnel. The separated solution was diluted with methylene chloride, combined with an excess of sodium tosylate solution, and then agitated at room temperature for 15 hours. The layer immiscible with water was removed from the solution and vacuum-dried. Through recrystallization or column chromatography, bis{4-[2-(vinyloxy)ethoxy]benzene}-3,5-dimethyl-4-[2-(vinyloxy)ethoxy]benzene sulfonium tosylate with 99% purity was obtained.

Bis{4-[2-(vinyloxy)ethoxy]benzene}-3,5-dimethyl-4-[2-(vinyloxy)ethoxy]benzene sulfonium tosylate: $^1$H NMR (300 MHz, methanol-d4, δ(ppm): 2.25–2.30(d, 6H, dimethyl and methyl of tosyl group), 4.02–4.38(m, 18H, vinyloxyethoxy), 6.50–6.80(q, 3H, vinyl), 7.10–7.90(m, 14H, benzene), 1R(KBr, cm$^{-1}$): 1635/1620($v_{C=C}$, vinyl ether), 1200($v_{C-O-C}$, vinyl ether), 982($δ_{CH}$, vinyl ether).

Example 1

Bis{4-[2-(vinyloxy)ethoxy]benzene}-3,5-dimethyl-4-methoxybenzene sulfonium triflate (1 g) and bis{4-[2-(vinyloxy)ethoxy]benzene}-3,5-dimethyl4-methoxybenzene sulfonium tosylate (1 g) as photoacid generators, and 100 g of poly(4-hydroxystyrene-co-4-(1-(ethoxy)ethoxy)styrene) having 34 mol % of 4-(1-(ethoxy)ethoxy)styrene were dissolved in 770 g of propylene glycol methyl ether acetate to prepare a photosensitive resist solution.

The resist solution was spin-coated on a Si wafer. The Si wafer was baked before exposure to actinic radiation at 90° C. for 90 seconds to form a resist film layer with a thickness of 0.7 μm. The Si wafer was exposed to KrF excimer laser radiation (248 nm) through a pattern mask, and baked after the exposure at 110° C. for 90 seconds. The Si wafer was puddled in an aqueous solution of 2.38 wt % of tetramethylammonium hydroxide for I minute, rinsed with pure water, and spin-dried.

A good positive pattern was developed with 0.15 μm line and space. The loss of the unexposed portion was not shown, and the exposed portion did not have any defects.

Comparative Example 1

Comparative Example 1 was conducted in the same manner as in Example 1 except that triphenyl sulfonium triflate (1 g) and triphenylsulfonium tosylate (1 g) were used as photoacid generator.

A positive pattern was developed with 0.34 μm line and space and T-top and declined pattern. The loss of the unexposed portion was about 5%, and the exposed portion exhibited defects.

Example 2

Example 2 was conducted in the same manner as in Example 1 except that bis{4-[2-(vinyloxy)ethoxy]benzene}-3,5-dimethyl-4-methoxybenzene sulfonium triflate (1 g) and bis{4-[2-(vinyloxy)ethoxy]benzene}-3,5-dimethyl4-methoxybenzene sulfonium tosylate (1 g) as photoacid generators, and 100 g of poly(4-hydroxystyrene-co-4-(1-(isobutoxy)ethoxy)styrene) having 24 mol % of 4-(1-(isobutoxy)ethoxy)styrene were dissolved in 770 g of cyclohexanone to prepare a photosensitive resist solution.

A good positive pattern was developed with 0.17 μm line and space. The loss of the unexposed portion was not shown, and the exposed portion did not have any defects.

Example 3

Example 3 was conducted in the same manner as in Example 1 except that bis{4-[2-(vinyloxy)ethoxy]benzene}-3,5-dimethyl-4-[2-(vinyloxy)ethoxy]benzene sulfonium tosylate (2 g) and bis{4-[2-(vinyloxy)ethoxy]benzene}-3,5-dimethyl-4-methoxybenzene sulfonium perfluoro-1-butanesulfonate (1 g) as photoacid generators, and 100 g of poly(4-hydroxystyrene-co-4-(1-(ethoxy)ethoxy)styrene) having 29 mol % of 4-(1-(isobutoxy)ethoxy)styrene were dissolved in 720 g of a mixture of ethyl cellosolve acetate and methyl ethyl ketone to prepare a photosensitive resist solution.

A good positive pattern was developed with 0.18 μm line and space. The loss of the unexposed portion was not shown, and the exposed portion did not have any defects.

Example 4

Example 4 was conducted in the same manner as in Example 1 except that tris{4-[2-(vinyloxy)ethoxy]benzene}sulfonium-10-camphorsulfonate (3 g) as thermal cross-linking photoacid generator and diphenyliodonium triflate (1 g) as conventional photoacid generator, and 100 g of poly(4-hydroxystyrene-co-4-(1-(ethoxy)ethoxy)styrene) having 33 mol % of 4-(1-(ethoxy)ethoxy)styrene were dissolved in 720 g of diethylene glycol dimethyl ether to prepare a photosensitive resist solution.

A good positive pattern was developed with 0.20 μm line and space. The loss of the unexposed portion was not shown, and the exposed portion did not have any defects.

Example 5

Example 5 was conducted in the same manner as in Example 1 except that bis{4-[2-(vinyloxy)ethoxy]benzene}-3,5-dimethyl-4-methoxybenzene sulfonium triflate (1 g) and bis{4-[2-(vinyloxy)ethoxy]benzene}-3,5-dimethyl-4-methoxybenzene sulfonium tosylate (1 g) as photoacid generators, 100 g of poly(4-hydroxystyrene-co-4-methoxystyrene), and 2,2-bis(4-(2-(vinyloxy)ethoxy)phenyl)propane (4 g) as heat cross-linking agent were dissolved in 750 g of a mixture of propylene glycol propyl ether acetate and xylene to prepare a photosensitive resist solution.

A good positive pattern was developed with 0.16 μm line and space. The loss of the unexposed portion was not shown, and the exposed portion did not have any defects.

Example 6

Example 6 was conducted in the same manner as in Example 1 except that bis{4-[2-(vinyloxy)ethoxy]benzene}-3,5-dimethyl-4-methoxybenzene sulfonium triflate (1 g) and tris{4-[2-(vinyloxy)ethoxy]benzene}sulfonium cyclohexane sulfamate (2 g) as photoacid generators, 1,2,3-tris(2-(vinyloxy)ethoxy)benzene (3 g) as heat cross-linking agent, and 100 g of poly(4-hydroxystyrene-co-4-butoxystyrene-co- 4-n-butyl methacrylate), were dissolved in 770 g of propylene glycol methyl ethyl acetate to prepare a photosensitive resist solution.

A good positive pattern was developed with 0.20 μm line and space. The loss of the unexposed portion was not shown, and the exposed portion did not have any defects.

Example 7

Example 7 was conducted in the same manner as in Example 1 except that bis{4-[2-(vinyloxy)ethoxy]benzene}-4-methoxybenzene sulfonium triflate (1 g) and bis{4-[2-(vinyloxy)ethoxy]benzene}-4-methoxybenzene sulfonium tosylate (2 g) as heat cross-linking photoacid generators, 1,2,3-trimethane sulfonylbenzene (1 g) as conventional photoacid generator, and 100 g of poly(4-hydroxystyrene-co-4-butoxystyrene-co-4-[1-(ethoxy)ethoxy]styrene), were dissolved in 770 g of a mixture of ethylene glycol monoethyl ether and propylene glycol methyl ethyl acetate to prepare a photosensitive resist solution.

A good positive pattern was developed with 0.15 μm line and space. The loss of the unexposed portion was not shown, and the exposed portion did not have any defects.

The present invention provides a positive working photoresist composition having high sensitivity and resolution, good photosensitivity to actinic radiation such as KrF excimer laser light, and high transmittance In the above, the present invention was described based on the preferred embodiment of the present invention, but it should be apparent to those ordinarily skilled in the art that various changes and modifications can be added without departing from the spirit and scope of the present invention. Such changes and modifications should come within the scope of the present invention.

What is claimed is:

1. A positive working photoresist composition comprising:

(a) a thermally cross-linkable photoacid generator represented by the general formula (I):

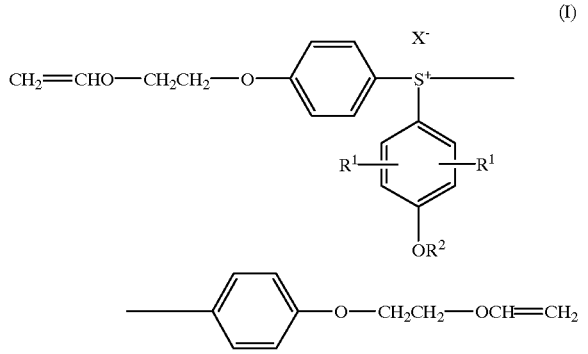

wherein
X is methanesulfonate, trifluoromethanesulfonate, 4-toluenesulfonate, 10-camphorsulfonate, cyclohexane sulfamate, perfluoro-1-butanesulfonate, Cl, Br, $SbF_6$, $BF_4$, $PF_4$, or $AsF_6$,
$R^1$ is methyl, and
$R^2$ is alkyl or vinyloxyethyl, (b) a binder polymer represented by the general formula (II):

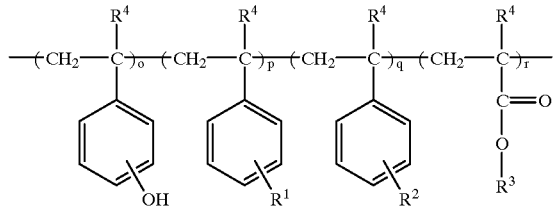

wherein
$R^1$ and $R^2$ are different from each other and are selected from the group consisting of acid labile groups, hydrogen, methoxy, ethoxy, n-butoxy and t-butoxy,
$R^3$ is hydrogen or alkyl of $C_{1-10}$,
$R^4$ is hydrogen or methyl,
$0<o<1$,
$0\leq p\leq 0.7$,
$0\leq q\leq 0.7$, and
$0\leq r\leq 0.3$,
wherein p, q and r are not 0 simultaneously, and (c) a solvent in which said thermally cross-linkable photoacid generator (a) and binder polymer (b) are dissolved.

2. The photoresist composition of claim 1 which $R^2$ of formula (a) is methyl or vinyloxyethyl.

3. The photoresist composition of claim 1, further comprising at least one thermal cross-linking agent for cross-linking but not generating acid.

4. The photoresist composition of claim 3 in which said thermal cross-linking agent for cross-linking but not generating acid is selected from the group consisting of 2,2-bis{4-[2-(vinyloxy)ethoxy]phenyl}propane, 1,1,1-tris {4-[2-(vinyloxy)ethoxy]phenyl}ethane, 1,3,5-tris[2-(vinyloxy)ethoxy]benzene, 1,2,3-tris[2-(vinyloxy)ethoxy]benzene, 2,2-bis{4-[2-(vinyloxy)ethoxy]cyclohexyl}propane, and 1,4-bis{4-[2-(vinyloxy)ethoxy]phenyl}cyclohexane.

5. The photoresist composition of claim 3 in which said thermal cross-linking agent is employed in an effective amount from about 0 to about 30% by weight based on the weight of said binder polymer.

6. The photoresist composition of claim 1, further comprising an additive selected from the group consisting of a surfactant, a sensitivity improving agent, an adhesive additive, and a stabilizing agent.

7. The photoresist composition of claim 1, in which said solvent is selected from the group consisting of ethylene glycol monomethyl ether, ethylene glycol monoethyl ether, methyl celosolve acetate, ethyl celosolve acetate, diethylene glycol monomethyl ether, diethylene glycol monoethyl ether, propylene glycol methyl ether acetate, propylene glycol propyl ether acetate, diethylene glycol diethyl ether, ethyl actate, toluene, xylene, methyl ethyl ketone, cyclohexanone, 2-heptanone, 3-heptanone, 4-heptanone, and mixtures thereof.

8. The photoresist composition of claim 1, further comprising an additional solvent selected from the group consisting of N-methylformamide, N,N-dimethylformamide, N-methylacetamide, N,N-dimethylacetamide, N-methylpyrrolidone, dimethylsulfoxide, and alcohols.

9. A thermally cross-linkable photoacid generator for a photoresist composition, which is represented by the general formula (I):

(I)

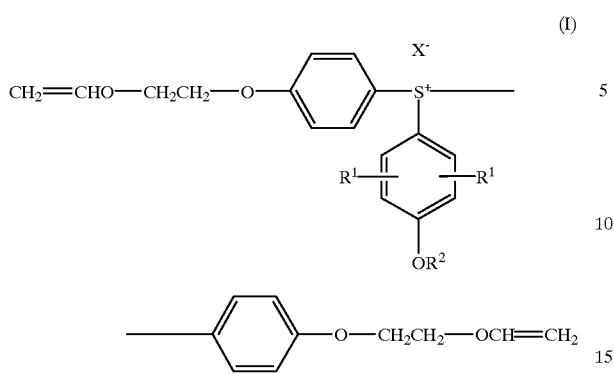

wherein

X is methanesulfonate, trifluoromethanesulfonate, 4-toluenesulfonate, 10-camphorsulfonate, cyclohexane sulfamate, perfluoro-1-butanesulfonate, Cl, Br, $SbF_6$, $BF_4$, $PF_4$, or $AsF_6$, $R^1$ is methyl, and $R^2$ is alkyl or vinyloxyethyl.

10. The photoacid generator of claim 9 in which $R^2$ of formula (a) is methyl or vinyloxyethyl.

11. A method of forming a resist pattern comprising the steps of i) applying a layer of a photoresist composition comprising:

(a) a thermally cross-linkable photoacid generator represented by the general formula (I):

(I)

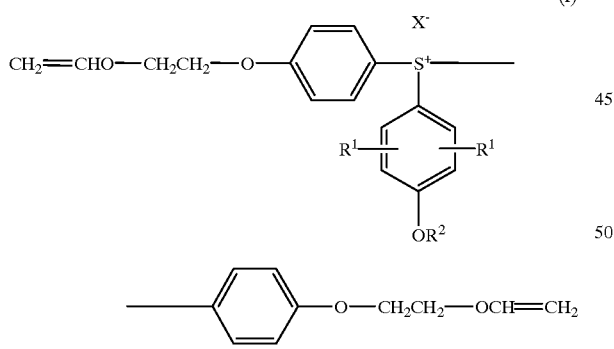

wherein

X is methanesulfonate, trifluoromethanesulfonate, 4-toluenesulfonate, 10-camphorsulfonate, cyclohexane sulfamate, perfluoro-1-butanesulfonate, Cl, Br, $SbF_6$, $BF_4$, $PF_4$, or $AsF_6$, $R^1$ is methyl, and $R^2$ is alkyl or vinyloxyethyl, (b) a binder polymer represented by the general formula (II):

(II)

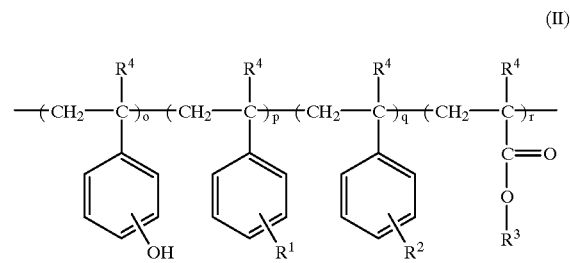

wherein $R^1$ and $R^2$ are different from each other and are selected from the group consisting of acid labile groups, hydrogen, methoxy, ethoxy, n-butoxy and t-butoxy, $R^3$ is hydrogen or alkyl of $C_{1-10}$, $R^4$ is hydrogen or methyl, $0<o<1$, $0 \leq p \leq 0.7$, $0 \leq q \leq 0.7$, and $0 \leq r \leq 0.3$, wherein p, q and r are not 0 simultaneously, and (c) a solvent in which said thermally cross-linkable photoacid generator (a) and binder polymer (b) are dissolved, onto a substrate;

v) heat treating said layer and then exposing said layer to actinic radiation or an electron beam through a pattern mask;

vi) heat treating said exposed layer; and vii) developing said exposed layer with a developer.

12. The method of claim 11, wherein in step ii) said layer is heat treated at a temperature from about 90 to about 140° C.

13. The method of claim 11, wherein in step ii) said layer is exposed to KrF excimer laser light having a wavelength of 248 nm.

14. A positive working photoresist composition comprising:

(a) a thermally cross-linkable photoacid generator represented by the general formula (I):

(I)

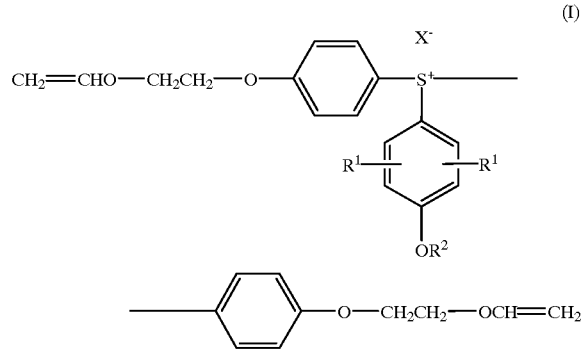

wherein

X is methanesulfonate, trifluoromethanesulfonate, 4-toluenesulfonate, 10-camphorsulfonate, cyclohexane sulfamate, perfluoro-1-butanesulfonate, Cl, Br, $SbF_6$, $BF_4$, $PF_4$, or $AsF_6$, $R^1$ is hydrogen or methyl, and $R^2$ is alkyl or vinyloxyethyl, (b) a binder polymer represented by the general formula (II):

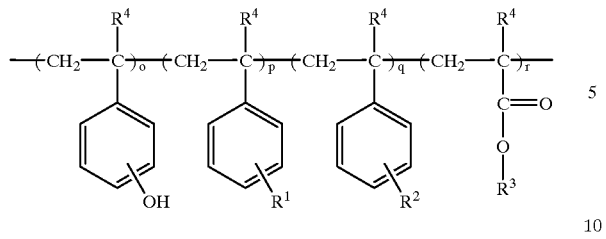

wherein
- $R^1$ and $R^2$ are acid labile groups that are different from each other and are selected from the group consisting of 1-ethoxyethoxy, 1-isobutoxyethoxy, 1-chloroethoxyethoxy, tetrahydropyranyloxy, t-butoxycarbonyloxy, trimethylsilyloxy, and vinyloxyethyl,
- $R^3$ is hydrogen or alkyl of $C_{1-10}$,
- $R^4$ is hydrogen or methyl,
- $0 < o < 1$,
- $0 \leq p \leq 0.7$,
- $0 \leq q \leq 0.7$, and
- $0 \leq r \leq 0.3$,
- wherein p, q and r are not 0 simultaneously, and (c) a solvent in which said thermally cross-linkable photoacid generator (a) and binder polymer (b) are dissolved.

15. The photoresist composition of claim 14, in which $R^2$ of formula (a) is methyl or vinyloxyethyl.

16. A method of forming a resist pattern comprising the steps of i) applying a layer of a photoresist composition comprising:

(a) a thermally cross-linkable photoacid generator represented by the general formula (I):

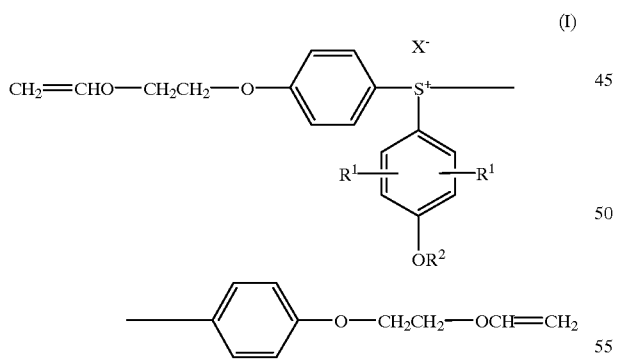

wherein
- X is methanesulfonate, trifluoromethanesulfonate, 4-toluenesulfonate, 10-camphorsulfonate, cyclohexane sulfamate, perfluoro-1-butanesulfonate, Cl, Br, $SbF_6$, $BF_4$, $PF_4$, or $AsF_6$,
- $R^1$ is hydrogen or methyl, and
- $R^2$ is alkyl or vinyloxyethyl, (b) a binder polymer represented by the general formula (II):

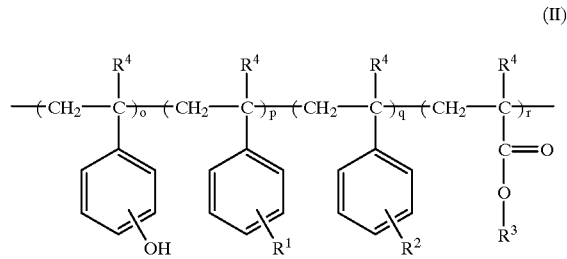

wherein
- $R^1$ and $R^2$ are acid labile groups that are different from each other and are selected from the group consisting of 1-ethoxyethoxy, 1-isobutoxyethoxy, 1-chloroethoxyethoxy, tetrahydropyranyloxy, t-butoxycarbonyloxy, trimethylsilyloxy, and vinyloxyethyl,
- $R^3$ is hydrogen or alkyl of $C_{1-10}$,
- $R^4$ is hydrogen or methyl,
- $0 < o < 1$,
- $0 \leq p \leq 0.7$,
- $0 \leq q \leq 0.7$, and
- $0 \leq r \leq 0.3$,
- wherein p, q and r are not 0 simultaneously, and (c) a solvent in which said thermally cross-linkable photoacid generator (a) and binder polymer (b) are dissolved, onto a substrate;

ii) heat treating said layer and then exposing said layer to actinic radiation or an electron beam through a pattern mask;

iii) heat treating said exposed layer; and iv) developing said exposed layer with a developer.

17. A positive working photoresist composition comprising:

(a) a thermally cross-linkable photoacid generator represented by the general formula (I):

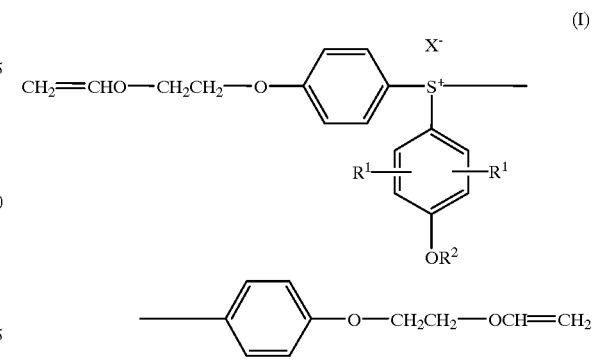

wherein
- X is methanesulfonate, trifluoromethanesulfonate, 4-toluenesulfonate, 10-camphorsulfonate, cyclohexane sulfamate, perfluoro-1-butanesulfonate, Cl, Br, $SbF_6$, $BF_4$, $PF_4$, or $AsF_6$,
- $R^1$ is hydrogen or methyl, and
- $R^2$ is alkyl or vinyloxyethyl, (b) a binder polymer represented by the general formula (II):

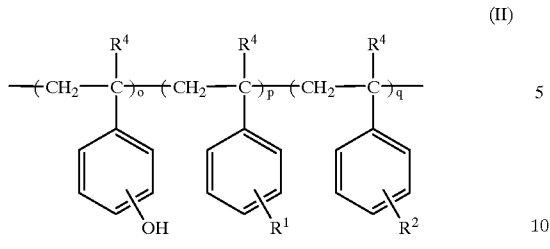

(II)

wherein
$R^1$ and $R^2$ are different from each other and are selected from the group consisting of acid labile groups, hydrogen, methoxy, ethoxy, n-butoxy and t-butoxy,
$R^3$ is hydrogen or alkyl of $C_{1-10}$,
$R^4$ is hydrogen or methyl,
$0<o<1$,
$0.05 \leq p \leq 0.45$, and
$0.05 \leq q \leq 0.45$, and (c) a solvent in which said thermally cross-linkable photoacid generator (a) and binder polymer (b) are dissolved.

18. The photoresist composition of claim 17 in which $R^2$ of formula (a) is methyl or vinyloxyethyl.

19. The photoresist composition of claim 17 in which said acid labile groups are selected from the group consisting of 1-ethoxyethoxy, 1-isobutoxyethoxy, 1-chloroethoxyethoxy, tetrahydropyranyloxy, t-butoxycarbonyloxy, trimethylsilyloxy, and vinyloxyethyl.

20. The photoresist composition of claim 17, further comprising at least one thermal cross-linking agent for cross-linking but not generating acid.

21. The photoresist composition of claim 17, further comprising an additive selected from the group consisting of a surfactant, a sensitivity improving agent, an adhesive additive, and a stabilizing agent.

22. The photoresist composition of claim 17, in which said solvent is selected from the group consisting of ethylene glycol monomethyl ether, ethylene glycol monoethyl ether, methyl celosolve acetate, ethyl celosolve acetate, diethylene glycol monomethyl ether, diethylene glycol monoethyl ether, propylene glycol methyl ether acetate, propylene glycol propyl ether acetate, diethylene glycol diethyl ether, ethyl actate, toluene, xylene, methyl ethyl ketone, cyclohexanone, 2-heptanone, 3-heptanone, 4-heptanone, and mixtures thereof.

23. The photoresist composition of claim 17, further comprising an additional solvent selected from the group consisting of N-methylformamide, N,N-dimethylformamide, N-methylacetamide, N,N-dimethylacetamide, N-methylpyrrolidone, dimethylsulfoxide, and alcohols.

24. A method of forming a resist pattern, comprising the steps of:
i) applying a layer of a photoresist composition comprising:
(a) a thermally cross-linkable photoacid generator represented by the general formula (I):

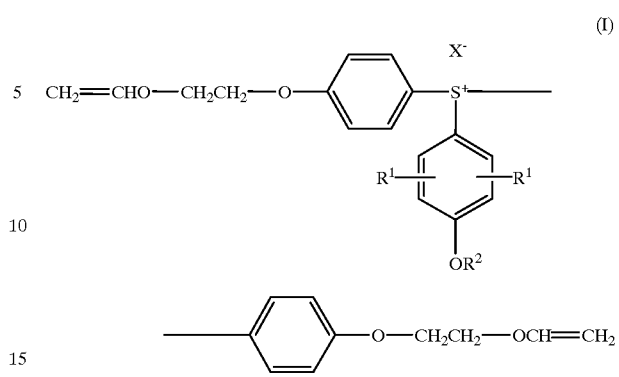

wherein
X is methanesulfonate, trifluoromethanesulfonate, 4-toluenesulfonate, 10-camphorsulfonate, cyclohexane sulfamate, perfluoro-1-butanesulfonate, Cl, Br, $SbF_6$, $BF_4$, $PF_4$, or $AsF_6$,
$R^1$ is hydrogen or methyl, and
$R^2$ is alkyl or vinyloxyethyl,
(b) a binder polymer represented by the general formula (II):

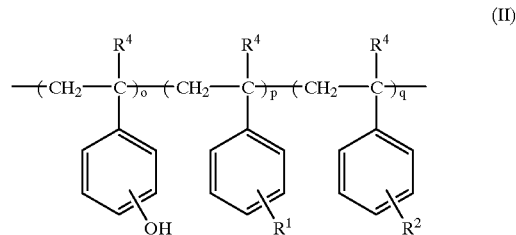

(II)

wherein
$R^1$ and $R^2$ are different from each other and are selected from the group consisting of acid labile groups, hydrogen, methoxy, ethoxy, n-butoxy and t-butoxy,
$R^3$ is hydrogen or alkyl of $C_{1-10}$,
$R^4$ is hydrogen or methyl,
$0<o<1$,
$0.05 \leq p \leq 0.45$, and
$0.05 \leq q \leq 0.45$, and (c) a solvent in which said thermally cross-linkable photoacid generator (a) and binder polymer (b) are dissolved, onto a substrate;

ii) heat treating said layer and then exposing said layer to actinic radiation or an electron beam through a pattern mask;

iii) heat treating said exposed layer; and iv) developing said exposed layer with a developer.

25. A positive working photoresist composition comprising:
(a) a thermally cross-linkable photoacid generator represented by the general formula (I):

(I)

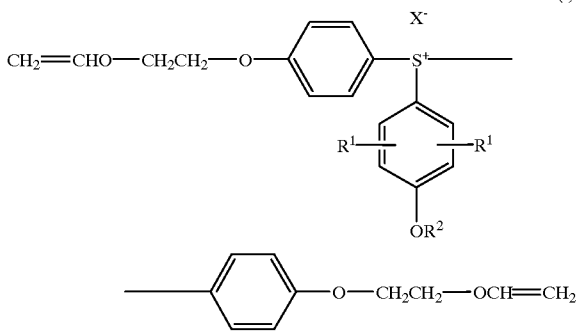

wherein

X is methanesulfonate, trifluoromethanesulfonate, 4-toluenesulfonate, 10-camphorsulfonate, cyclohexane sulfamate, perfluoro-1-butanesulfonate, Cl, Br, $SbF_6$, $BF_4$, $PF_4$, or $AsF_6$, $R^1$ is hydrogen or methyl, and $R^2$ is alkyl, (b) at least one photoacid generator for generating acid but not cross-linking, (c) a binder polymer represented by the general formula (II):

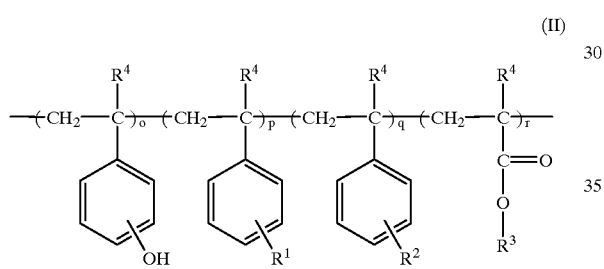

wherein $R^1$ and $R^2$ are different from each other and are selected from the group consisting of acid labile groups, hydrogen, methoxy, ethoxy, n-butoxy and t-butoxy, $R^3$ is hydrogen or alkyl of $C_{1-10}$, $R^4$ is hydrogen or methyl, $0<o<1$, $0 \leq p \leq 0.7$, $0 \leq q \leq 0.7$, and $0 \leq r \leq 0.3$, wherein p, q and r are not 0 simultaneously, and (d) a solvent in which said thermally cross-linkable photoacid generators (a) and (b) and binder polymer (c) are dissolved.

26. The photoresist composition of claim 25 in which said photoacid generator for generating acid but not cross-linking is selected from the group consisting of sulfonium salts, iodonium salts, phosphonium salts, diazonium salts, ammonium salts, selenium salts, halogen-containing compounds, diazoketones, sulphones or sulfonic compounds, and nitrobenzyl ester compounds.

27. The photoresist composition of claim 25, further comprising at least one thermal cross-linking agent for cross-linking but not generating acid.

28. The photoresist composition of claim 25, further comprising an additive selected from the group consisting of a surfactant, a sensitivity improving agent, an adhesive additive, and a stabilizing agent.

29. The photoresist composition of claim 25, in which said solvent is selected from the group consisting of ethylene glycol monomethyl ether, ethylene glycol monoethyl ether, methyl celosolve acetate, ethyl celosolve acetate, diethylene glycol monomethyl ether, diethylene glycol monoethyl ether, propylene glycol methyl ether acetate, propylene glycol propyl ether acetate, diethylene glycol diethyl ether, ethyl actate, toluene, xylene, methyl ethyl ketone, cyclohexanone, 2-heptanone, 3-heptanone, 4-heptanone, and mixtures thereof.

30. The photoresist composition of claim 25, further comprising an additional solvent selected from the group consisting of N-methylformamide, N,N-dimethylformamide, N-methylacetamide, N,N-dimethylacetamide, N-methylpyrrolidone, dimethylsulfoxide, and alcohols.

31. A method of forming a resist pattern comprising the steps of i) applying a layer of a photoresist composition comprising:

(a) a thermally cross-linkable photoacid generator represented by the general formula (I):

(I)

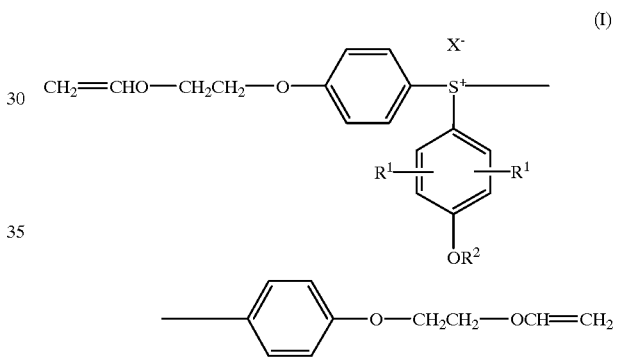

wherein

X is methanesulfonate, trifluoromethanesulfonate, 4-toluenesulfonate, 10-camphorsulfonate, cyclohexane sulfamate, perfluoro-1-butanesulfonate, Cl, Br, $SbF_6$, $BF_4$, $PF_4$, or $AsF_6$, $R^1$ is hydrogen or methyl, and $R^2$ is alkyl, (b) at least one photoacid generator for generating acid but not cross-linking, (c) a binder polymer represented by the general formula (II):

(II)

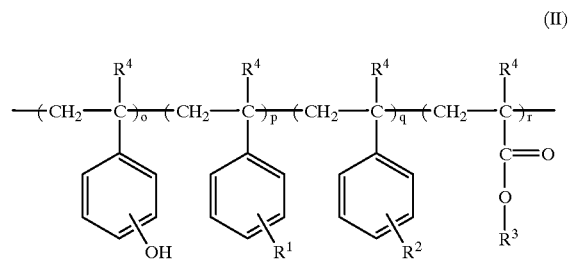

wherein
R¹ and R² are different from each other and are selected from the group consisting of acid labile groups, hydrogen, methoxy, ethoxy, n-butoxy and t-butoxy,
$R^3$ is hydrogen or alkyl of $C_{1-10}$,
$R^4$ is hydrogen or methyl,
0<o<1,
0≦p≦0.7,
0≦q≦0.7, and
0≦r≦0.3,
wherein p, q and r are not 0 simultaneously, and (c) a solvent in which said thermally cross-linkable photoacid generators (a) and (b) and binder polymer (c) are dissolved, onto a substrate;

ii) heat treating said layer and then exposing said layer to actinic radiation or an electron beam through a pattern mask;

iii) heat treating said exposed layer; and iv) developing said exposed layer with a developer.

* * * * *